US009053996B2

(12) United States Patent
Iwane et al.

(10) Patent No.: US 9,053,996 B2
(45) Date of Patent: Jun. 9, 2015

(54) SOLID-STATE IMAGING APPARATUS WITH A PLURALITY OF PROCESSING PORTIONS

(71) Applicant: CANON KABUSHIKI KAISHA, Tokyo (JP)

(72) Inventors: Masaaki Iwane, Sagamihara (JP); Yuichiro Yamashita, Hsinchu (TW); Akira Okita, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 142 days.

(21) Appl. No.: 13/772,924

(22) Filed: Feb. 21, 2013

(65) Prior Publication Data
US 2013/0222631 A1  Aug. 29, 2013

(30) Foreign Application Priority Data

Feb. 29, 2012  (JP) .................................. 2012-044307

(51) Int. Cl.
| | |
|---|---|
| *H04N 5/335* | (2011.01) |
| *H04N 3/14* | (2006.01) |
| *H01L 27/146* | (2006.01) |
| *H04N 5/232* | (2006.01) |
| *H04N 5/378* | (2011.01) |
| *H04N 5/374* | (2011.01) |
| *H04N 5/357* | (2011.01) |
| *H04N 5/365* | (2011.01) |

(52) U.S. Cl.
CPC ...... *H01L 27/14601* (2013.01); *H04N 5/23229* (2013.01); *H04N 5/378* (2013.01); *H04N 5/374* (2013.01); *H04N 5/357* (2013.01); *H04N 5/3658* (2013.01); *H01L 27/14603* (2013.01); *H01L 27/14609* (2013.01)

(58) Field of Classification Search
CPC ... H04N 5/37457; H04N 5/374; H04N 5/357; H04N 5/378
USPC ......................................................... 348/300
See application file for complete search history.

(56) References Cited

U.S. PATENT DOCUMENTS

| | | | |
|---|---|---|---|
| 7,187,052 B2 | 3/2007 | Okita et al. .................... 257/444 |
| 7,294,818 B2 | 11/2007 | Matsuda et al. ........... 250/208.1 |
| 7,321,110 B2 | 1/2008 | Okita et al. ................ 250/208.1 |
| 7,408,210 B2 | 8/2008 | Ogura et al. ................... 257/233 |
| 7,456,880 B2 | 11/2008 | Okita et al. .................... 348/243 |
| 7,460,162 B2 | 12/2008 | Koizumi et al. .............. 348/294 |
| 7,466,003 B2 | 12/2008 | Ueno et al. ..................... 257/462 |
| 7,514,732 B2 | 4/2009 | Okita et al. .................... 257/292 |

(Continued)

FOREIGN PATENT DOCUMENTS

JP     2009-224524 A   10/2009

*Primary Examiner* — Ahmed A Berhan
(74) *Attorney, Agent, or Firm* — Fitzpatrick, Cella, Harper & Scinto

(57) ABSTRACT

A solid-state imaging apparatus comprises a plurality of pixel units forming a pixel array, and a plurality of processing portions each corresponding to each column of the pixel array respectively, and each of the plurality of processing portions comprising a first front-side capacitor configured to hold a first signal having a noise component, a second front-side capacitor configured to hold a second signal having the noise component and a signal component, a first transfer portion configured to transfer the first signal from the first front-side capacitor to a first back-side capacitor, and a second transfer portion configured to transfer the second signal from the second front-side capacitor to a second back-side capacitor, wherein positions of the first and the second transfer portions are different from each other in a direction of the column.

5 Claims, 16 Drawing Sheets

(56) References Cited

U.S. PATENT DOCUMENTS

| | | | |
|---|---|---|---|
| 7,538,804 B2 | 5/2009 | Okita et al. | 348/241 |
| 7,538,810 B2 | 5/2009 | Koizumi et al. | 348/308 |
| 7,550,793 B2 | 6/2009 | Itano et al. | 257/239 |
| 7,557,847 B2 | 7/2009 | Okita et al. | 348/308 |
| 7,598,992 B2 * | 10/2009 | Matsuda | 348/294 |
| 7,623,056 B2 | 11/2009 | Yamashita | 341/163 |
| 7,633,539 B2 | 12/2009 | Yamashita | 348/294 |
| 7,755,688 B2 * | 7/2010 | Hatano et al. | 348/300 |
| 7,817,199 B2 | 10/2010 | Yamashita et al. | 348/308 |
| 7,872,286 B2 | 1/2011 | Okita et al. | 257/291 |
| 7,928,477 B2 | 4/2011 | Kobayashi et al. | 257/225 |
| 7,935,995 B2 | 5/2011 | Watanabe et al. | 257/292 |
| 8,009,213 B2 | 8/2011 | Okita et al. | 348/300 |
| 8,094,225 B2 | 1/2012 | Yamashita | 348/302 |
| 8,106,955 B2 | 1/2012 | Okita et al. | 348/220.1 |
| 8,111,311 B2 | 2/2012 | Iwane | 348/294 |
| 8,115,848 B2 | 2/2012 | Onuki et al. | 348/308 |
| 8,139,133 B2 | 3/2012 | Iwane et al. | 348/308 |
| 8,158,920 B2 | 4/2012 | Suzuki et al. | 250/208.1 |
| 8,159,573 B2 | 4/2012 | Suzuki et al. | 348/294 |
| 8,169,498 B2 | 5/2012 | Yamashita | 348/222.1 |
| 8,199,235 B2 | 6/2012 | Okita et al. | 348/301 |
| 8,278,613 B2 | 10/2012 | Okita et al. | 250/214 A |
| 8,325,260 B2 | 12/2012 | Yamazaki et al. | 348/308 |
| 8,345,137 B2 | 1/2013 | Shinohara et al. | 348/308 |
| 8,427,564 B2 | 4/2013 | Yamashita et al. | 348/294 |
| 8,441,564 B2 | 5/2013 | Yamashita | 348/299 |
| 2005/0285958 A1 * | 12/2005 | Matsuda | 348/300 |
| 2007/0046795 A1 * | 3/2007 | Yamashita | 348/294 |
| 2008/0055445 A1 * | 3/2008 | Hatano et al. | 348/302 |
| 2010/0165167 A1 | 7/2010 | Sugiyama et al. | 348/311 |
| 2010/0182465 A1 | 7/2010 | Okita | 348/273 |
| 2010/0289933 A1 | 11/2010 | Ryoki et al. | 348/300 |
| 2010/0328302 A1 | 12/2010 | Yamashita et al. | 345/214 |
| 2011/0032379 A1 | 2/2011 | Kobayashi et al. | 348/222.1 |
| 2011/0080492 A1 | 4/2011 | Matsuda et al. | 348/222.1 |
| 2011/0080493 A1 | 4/2011 | Kono et al. | 348/222.1 |
| 2011/0157398 A1 | 6/2011 | Okita et al. | 348/222.1 |
| 2011/0234868 A1 | 9/2011 | Yamashita et al. | 348/294 |
| 2011/0242380 A1 | 10/2011 | Ogura et al. | 348/300 |
| 2011/0273598 A1 | 11/2011 | Ogino et al. | 348/272 |
| 2012/0006993 A1 | 1/2012 | Arishima et al. | 250/369 |
| 2012/0007197 A1 | 1/2012 | Kikuchi et al. | 257/429 |
| 2012/0007203 A1 | 1/2012 | Kono et al. | 257/435 |
| 2012/0008030 A1 | 1/2012 | Kono et al. | 348/301 |
| 2012/0008031 A1 | 1/2012 | Yamashita et al. | 348/302 |
| 2012/0008177 A1 | 1/2012 | Fujimura et al. | 358/482 |
| 2012/0194696 A1 | 8/2012 | Ohshitanai et al. | 348/222.1 |
| 2012/0307100 A1 | 12/2012 | Iwane | 348/222.1 |
| 2013/0083225 A1 | 4/2013 | Minowa et al. | 348/294 |
| 2013/0113966 A1 | 5/2013 | Arishima et al. | 348/301 |
| 2013/0147996 A1 | 6/2013 | Minowa et al. | 348/301 |

* cited by examiner

F I G. 6
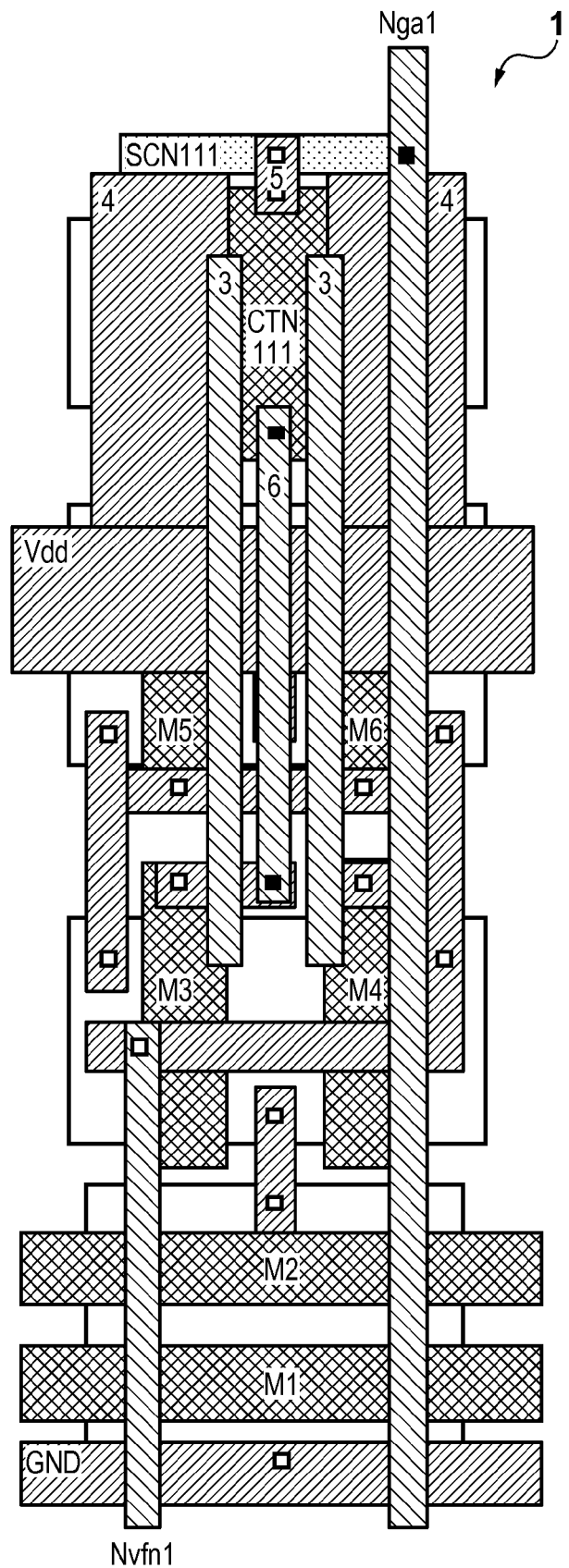

F I G. 7
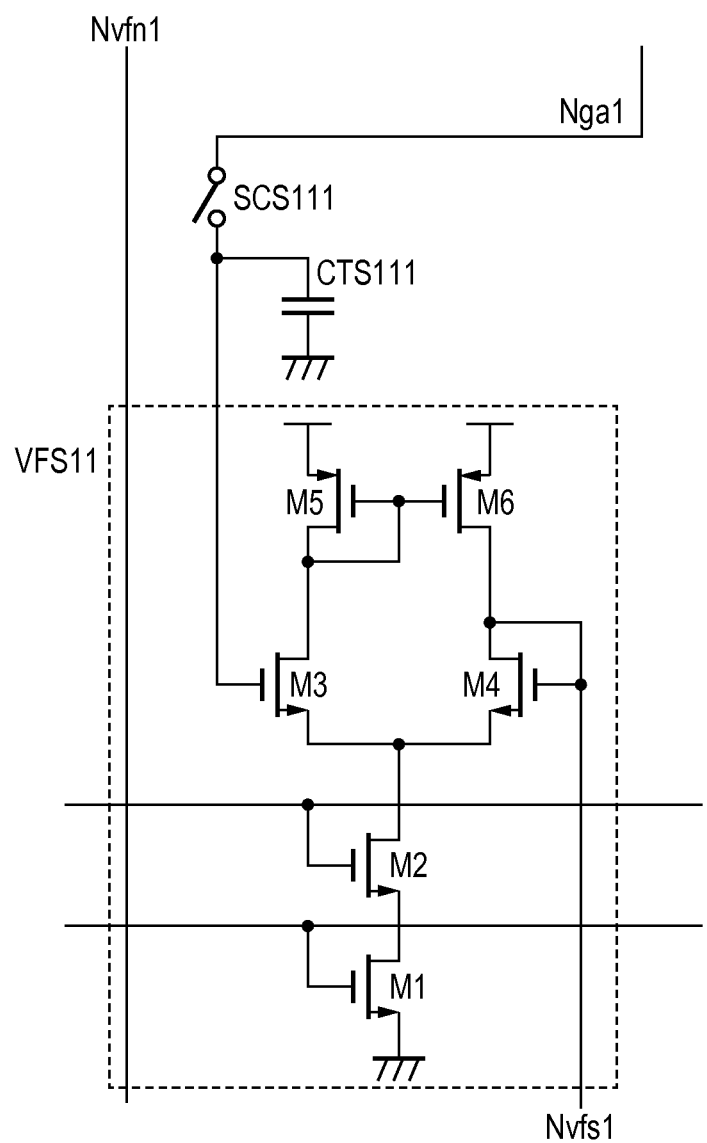

F I G. 15
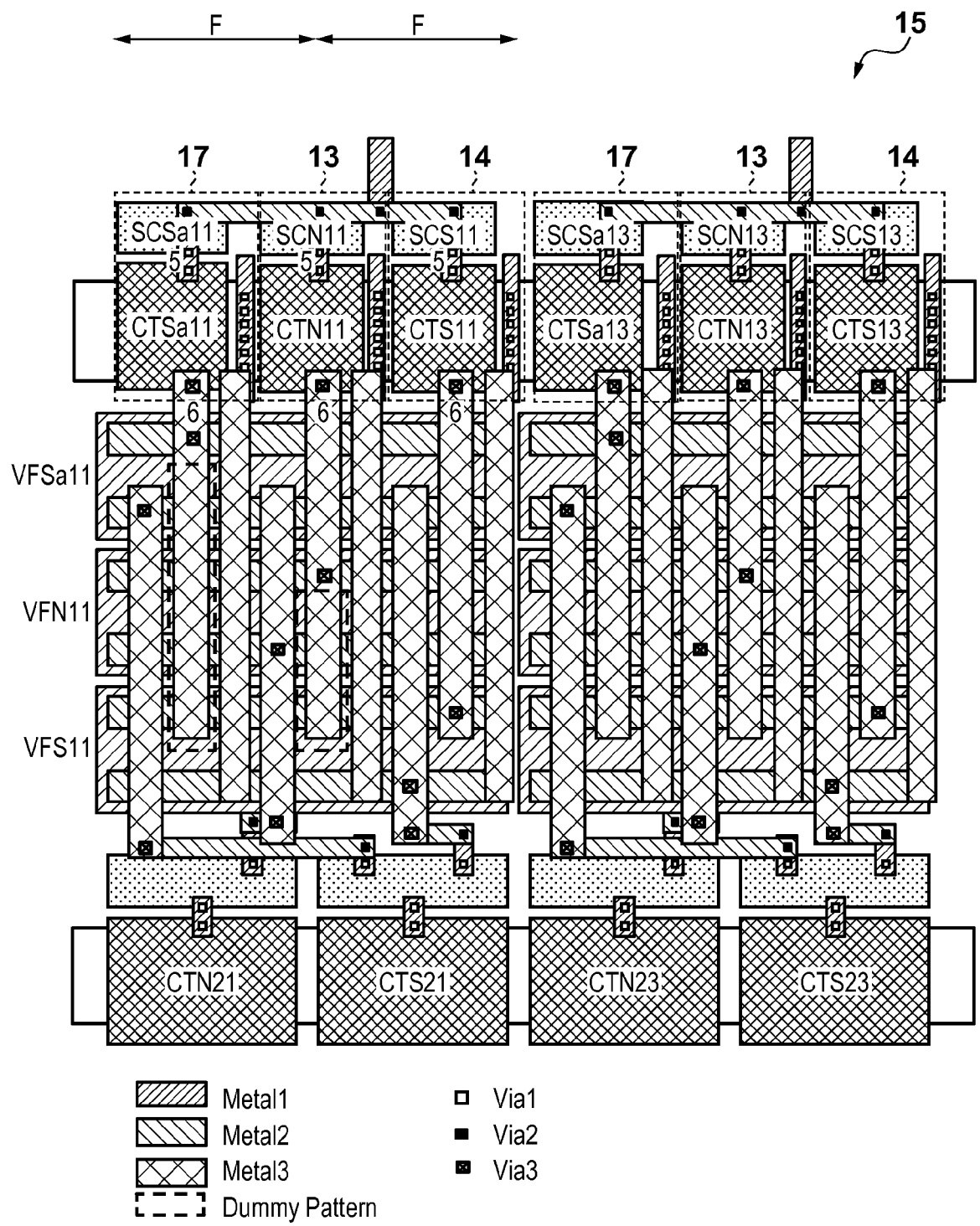

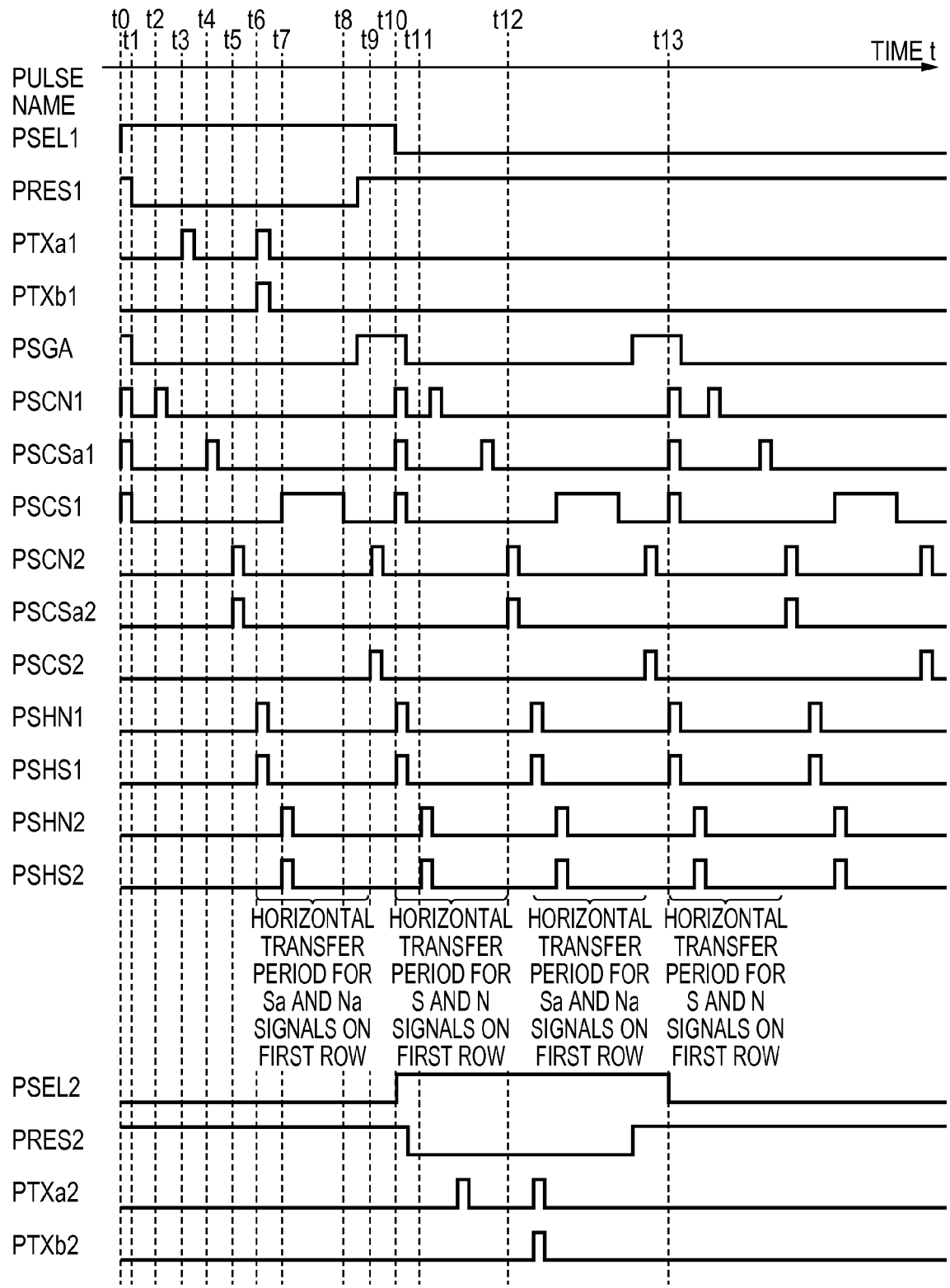

US 9,053,996 B2

SOLID-STATE IMAGING APPARATUS WITH A PLURALITY OF PROCESSING PORTIONS

BACKGROUND OF THE INVENTION

1. Field of the Invention

The present invention relates to a solid-state imaging apparatus.

2. Description of the Related Art

As a technique of reading out the pixel signals of the pixel array of a solid-state imaging apparatus at high speed, for example, Japanese Patent Laid-Open No. 2009-224524 discloses an imaging apparatus (solid-state imaging apparatus) including a first holding capacitor and a second holding capacitor. According to Japanese Patent Laid-Open No. 2009-224524, the imaging apparatus parallelly executes processing of holding pixel signals output from the pixel array in one of the first holding capacitor and the second holding capacitor, and processing of outputting the held pixel signals to the other holding capacitor, thereby reading out the pixel signals.

Each processing portion is generally arranged to fit within a pixel pitch in the horizontal direction (row direction) of a pixel array. The pixel pitch decreases as the number of pixels increases, thereby making it difficult to design the layout of the processing portions.

SUMMARY OF THE INVENTION

The present invention provides an advantageous technique for an increase in number of pixels of a solid-state imaging apparatus and a high-speed readout operation of pixel signals.

One of the aspects of the present invention provides a solid-state imaging apparatus comprising a pixel array in which a plurality of pixel units are arranged to form a plurality of rows and a plurality of columns, and a plurality of processing portions each corresponding to each of the plurality of columns of the pixel array, each of the plurality of pixel units comprising at least one photoelectric conversion element, and each of the plurality of processing portions comprising a first front-side capacitor configured to hold a first signal having a noise component, a first back-side capacitor arranged behind the first front-side capacitor, a second front-side capacitor configured to hold a second signal having the noise component and a signal component corresponding to an amount of light incident on a corresponding pixel unit, a second back-side capacitor arranged behind the second front-side capacitor, a first transfer portion configured to transfer the first signal from the first front-side capacitor to the first back-side capacitor, and a second transfer portion configured to transfer the second signal from the second front-side capacitor to the second back-side capacitor, wherein positions of the first transfer portion and the second transfer portion are different from each other in a direction parallel to a column direction of the pixel array.

Further features of the present invention will become apparent from the following description of exemplary embodiments with reference to the attached drawings.

BRIEF DESCRIPTION OF THE DRAWINGS

FIG. 6 is a view for explaining a practical example of the layout of the first transfer portion;

FIG. 7 is a circuit diagram for explaining an example of the arrangement of a second transfer portion;

FIG. 15 is a view for explaining a practical example of the layout of the solid-state imaging apparatus according to the third embodiment; and FIG. 16 is a timing chart for explaining an example of a driving method for the solid-state imaging apparatus according to the third embodiment.

DESCRIPTION OF THE EMBODIMENTS

First Embodiment

Figure 1:
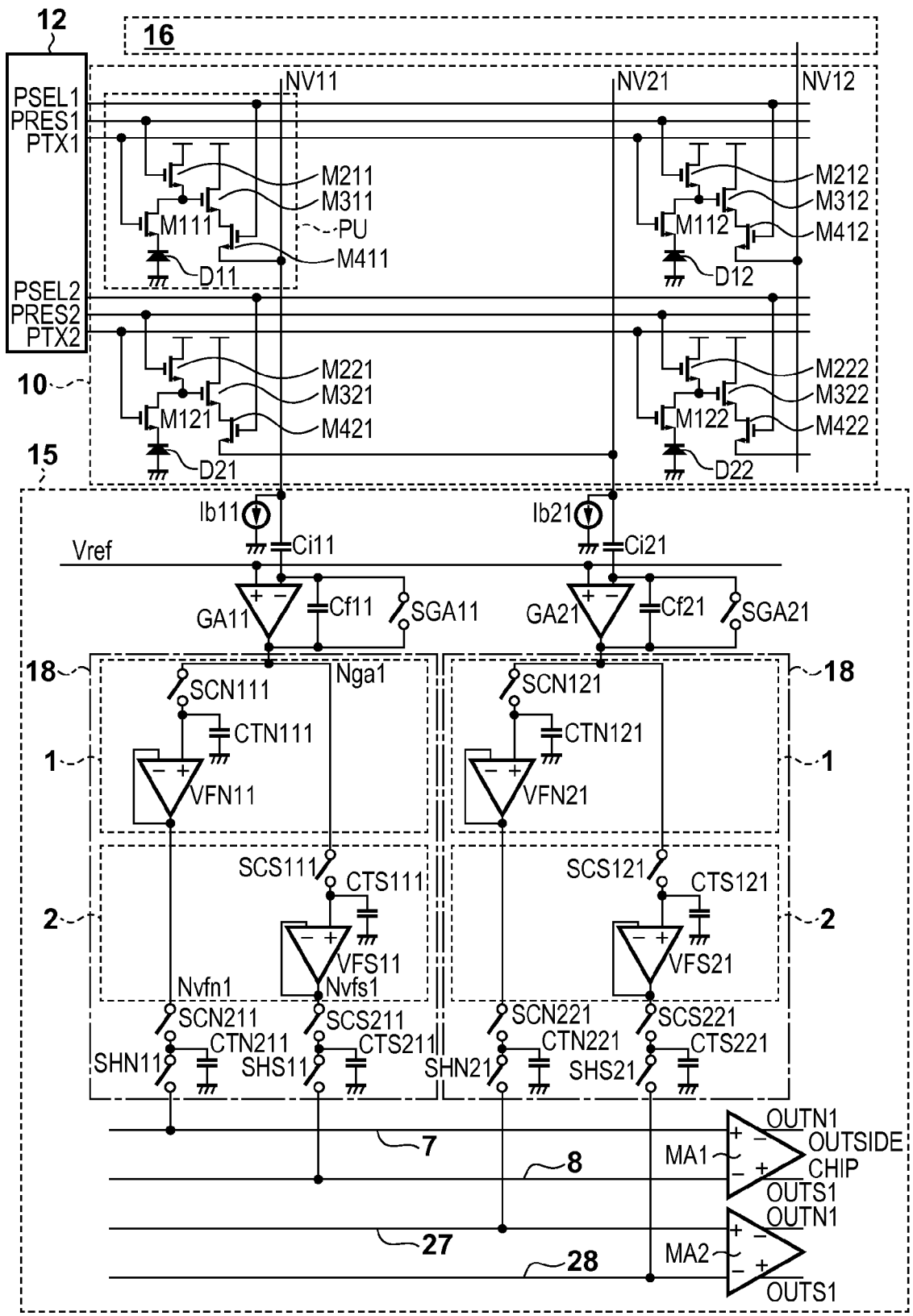
FIG. 1 is a circuit diagram for explaining an example of the arrangement of a solid-state imaging apparatus according to the first embodiment.

A solid-state imaging apparatus 101 according to the first embodiment will be described with reference to FIGS. 1 to 10. FIG. 1 shows an example of the arrangement of the solid-state imaging apparatus 101. The solid-state imaging apparatus 101 comprises a pixel array 10 in which a plurality of pixel units PU are arranged to form a plurality of rows and a plurality of columns, a vertical scanning circuit 12 for controlling the pixel array 10, and a reading portion 15 including a plurality of processing portions 18 each of which corresponds to each of the plurality of columns of the pixel array 10. Only 2×2 pixel units PU of the pixel array 10 are shown for the sake of simplicity.

The pixel unit PU on the first row and first column includes at least one photoelectric conversion element D11, a transfer transistor M111, a reset transistor M211, a source follower transistor M311, and a selection transistor M411. For example, a photodiode is used as the photoelectric conversion element D11. A control signal PTX1 is supplied to the gate terminal of the transfer transistor M111. When the control signal PTX1 is activated, the transfer transistor M111 enters a conductive state, and charges which have been generated upon receiving light and accumulated in the photoelectric conversion element D11 are transferred to a floating diffusion capacitor (to be referred to as an "FD capacitor" hereinafter) (not shown). The FD capacitor indicates the diffusion layer capacitor of a diffusion layer of the transfer transistor M111, and is connected to the gate terminal of the source follower transistor M311. The potential of the gate terminal of the source follower transistor M311 may vary depending on the charges which have been generated upon receiving light and accumulated in the photoelectric conversion element D11. The amount of current flowing through the source follower transistor M311 can change depending on potential fluctuations at the gate terminal. A control signal PSEL1 is supplied to the gate terminal of the selection transistor M411. When the control signal PSEL1 is activated, the selection transistor M411 can output, to a column signal line NV11, a pixel signal corresponding to the current amount of the source follower transistor M311. A control signal PRES1 is supplied to the gate terminal of the reset transistor M211. When the control signal PRES1 is activated, the reset transistor M211 can reset the potential of the gate terminal of the source follower transistor M311. This also applies to the remaining pixel units PU.

The reading portion 15 includes a constant-current source Ib11 connected to the column signal line NV11. The reading portion 15 also includes a column amplifier including capacitors Ci11 and Cf11, a switch SGA11, and a gain amplifier GA11. The column amplifier amplifies a pixel signal input through the column signal line NV11, and outputs it from a node Nga1. Furthermore, the reading portion 15 includes the processing portions 18 corresponding to the respective columns of the pixel array 10. Each processing portion 18 includes a first front-side capacitor CTN111, a first back-side capacitor CTN211, a second front-side capacitor CTS111, a second back-side capacitor CTS211, a first transfer portion (buffer VFN11), and a second transfer portion (buffer VFS11). The capacitor CTN111 is connected to the node Nga1 by a switch SCN111, and holds a first signal (to be referred to as an "N signal" hereinafter) having a noise component. Note that if the column signal line NV11 is connected to the above-described column amplifier as in the embodiment, the noise component can include the offset component of the column amplifier. On the other hand, if there is no column amplifier, the noise component corresponds to a noise level that can be output through the column signal line NV11 after the reset operation is performed in the pixel unit PU performs and before the charges are transferred from the photoelectric conversion element D11. The capacitor CTN211 is arranged behind (at the following stage of) the capacitor CTN111. The capacitor CTS111 is connected to the node Nga1 by a switch SCS111, and holds a second signal (to be referred to as an "S signal" hereinafter) having a noise component and a signal component corresponding to the amount of light incident on the pixel unit. The capacitor CTS211 is arranged behind (at the following stage of) the capacitor CTS111. The buffer VFN11 transfers the N signal from the capacitor CTN111 to the capacitor CTN211. The buffer VFS11 transfers the N signal from the capacitor CTS111 to the capacitor CTS211. A region 1 includes the switch SCN111, the capacitor CTN111, and the first transfer portion (buffer VFN11). A region 2 includes the switch SCS111, the capacitor CTS111, and the second transfer portion (buffer VFS11). This also applies to remaining column signal lines NV21, NV12, and the like.

The reading portion 15 also includes horizontal transfer lines 7 and 27 for N signals, horizontal transfer lines 8 and 28 for S signals, and output amplifiers MA1 and MA2. The output amplifier MA1 has a non-inverting terminal connected to the horizontal transfer line 7, and an inverting terminal connected to the horizontal transfer line 8. The output amplifier MA2 has a non-inverting terminal connected to the horizontal transfer line 27, and an inverting terminal connected to the horizontal transfer line 28. With the above-described arrangement, the analog signal of the difference between an N signal and an S signal is read out. Note that a so-called two-line readout operation is performed, in which pixel signals for two columns of the pixel array 10 are simultaneously read out in the arrangement including the two output amplifiers MA1 and MA2.

Figure 2:
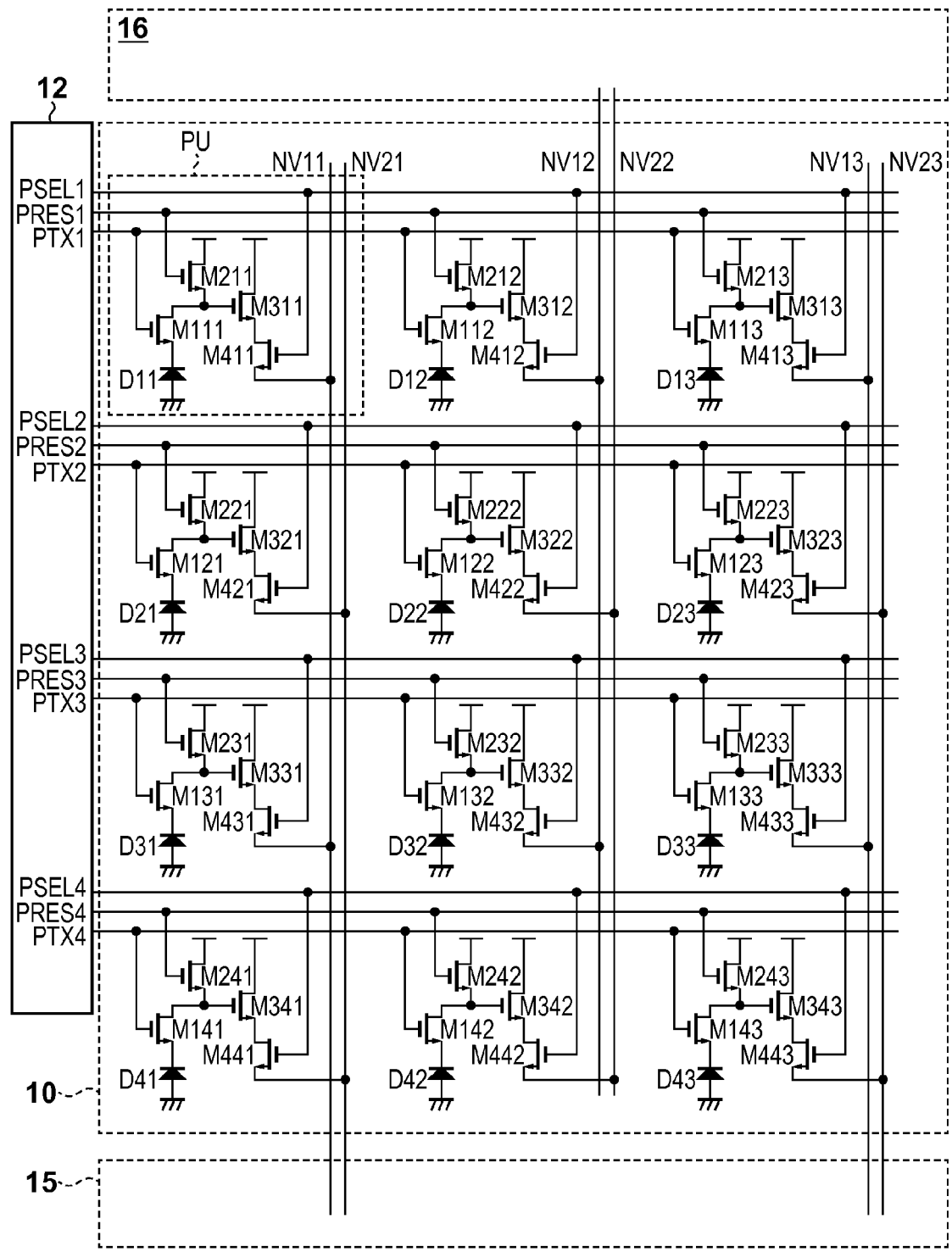
FIG. 2 is a circuit diagram for explaining an example of the arrangement of the pixel array of the solid-state imaging apparatus according to the first embodiment.

FIG. 2 shows 4×3 pixel units PU of the pixel array 10. The pixel units PU on the first column and odd-numbered rows are connected to the column signal line NV11. The pixel units PU on the first column and even-numbered rows are connected to the column signal line NV21. The pixel units PU on the second column and odd-numbered rows are connected to the column signal line NV12. The pixel units PU on the second column and even-numbered rows are connected to a column signal line NV22. The pixel units PU on the third column and odd-numbered rows are connected to a column signal line NV13. The pixel units PU on the third column and even-numbered rows are connected to a column signal line NV23. In this example, the column signal lines NV11, NV12, NV13, and NV23 are connected to the reading portion 15, and the column signal lines NV12 and NV22 are connected to a reading portion 16 with the same arrangement as that of the reading portion 15. That is, the column signal lines on the odd-numbered columns are connected to the reading portion 15, and the column signal lines on the even-numbered columns are connected to the reading portion 16. The reading portions 15 and 16 can parallelly execute signal processes for readout pixel signals.

Figure 3:
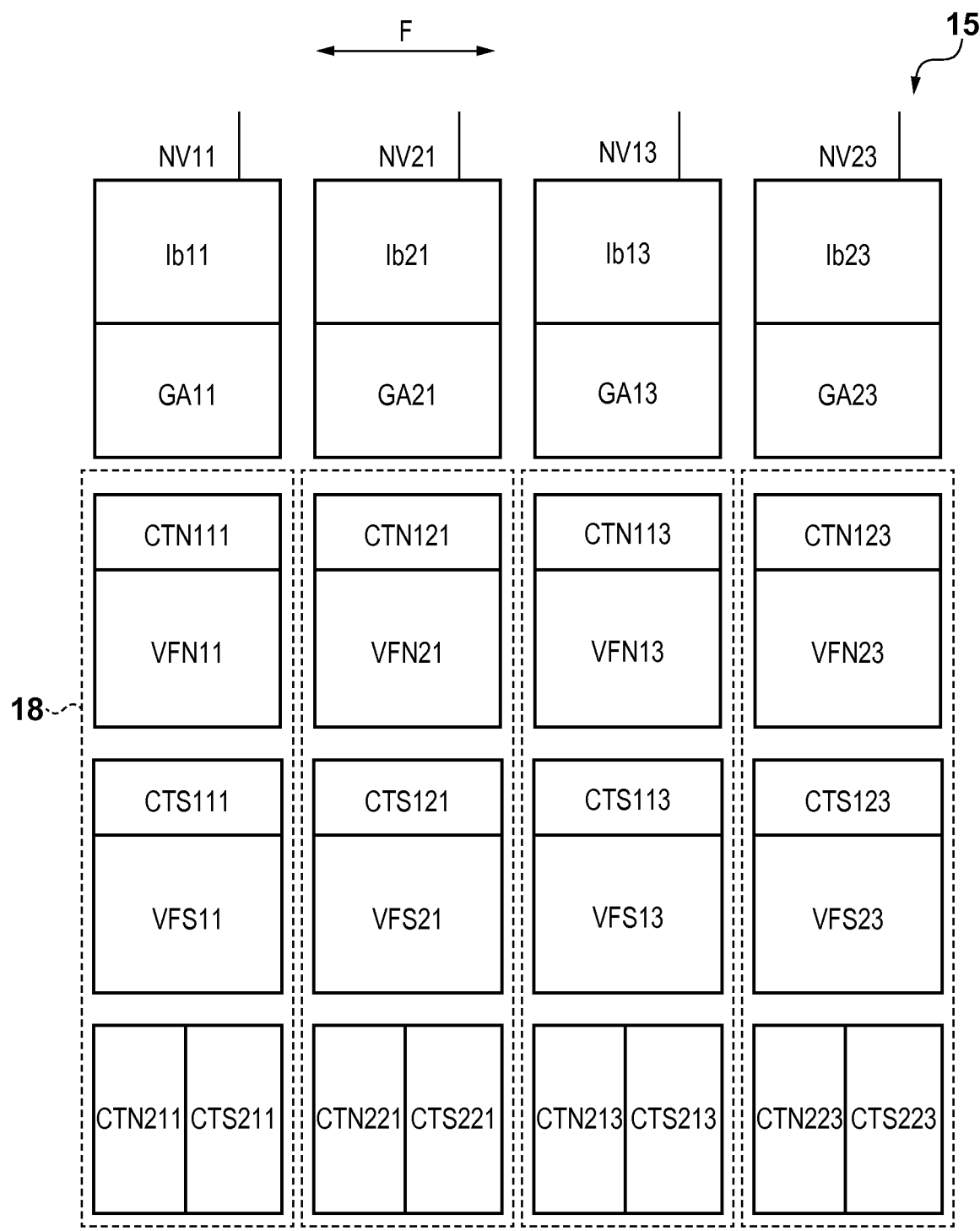
FIG. 3 is a block diagram for explaining an overview of the layout of the solid-state imaging apparatus according to the first embodiment.

FIG. 3 is a block diagram schematically showing the layout of a part corresponding to the reading portion 15 of the solid-state imaging apparatus 101. The capacitor CTN111 and buffer VFN11, and the capacitor CTS111 and buffer VFS11 are arranged to fit within a pixel pitch F. The capacitor CTN111 and buffer VFN11 are arranged at a position different from that of the capacitor CTS111 and buffer VFS11 in a direction parallel to the column direction of the pixel array 10.

Figure 4:
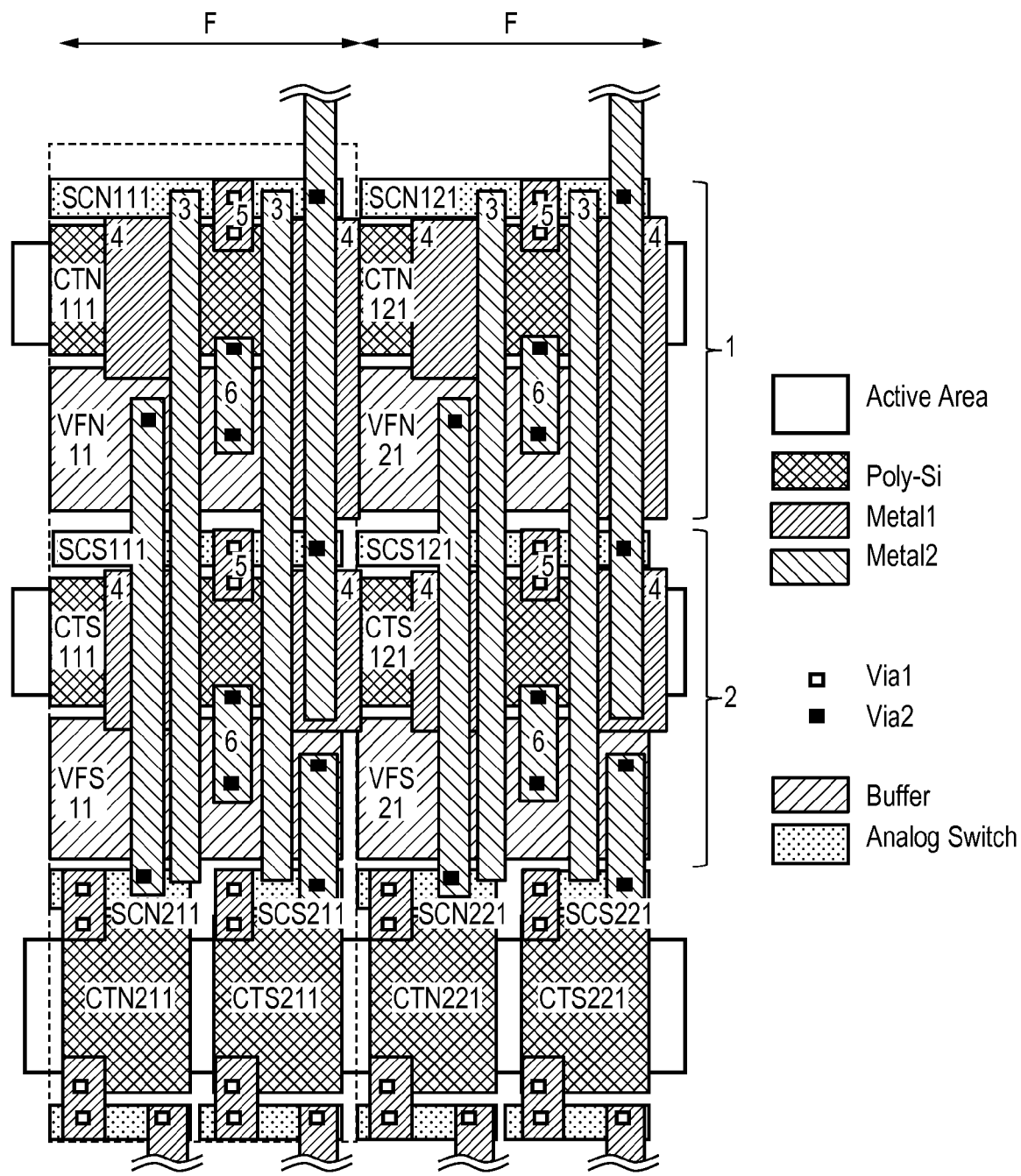
FIG. 4 is a view for explaining a practical example of the layout of the solid-state imaging apparatus according to the first embodiment.

FIG. 4 shows a practical example of the layout of a part corresponding to the processing portions 18 of the solid-state imaging apparatus 101. A polysilicon (Poly-Si) or active area (Active Area) and a first interconnection layer (Metal1) are electrically connected with each other through via 1 (Via1). The first interconnection layer and a second interconnection layer (Metal2) are electrically connected with each other through via 2 (Via2). Dotted lines in FIG. 4 indicate a unit region for repeating a layout arrangement.

For example, the capacitor CTN111 preferably has translational symmetry with each of other capacitors CTN121, CTS111, and CTS121. By adopting a structure having translational symmetry, the capacitors CTN111 have identical capacitor components and resistance components including parasitic capacitors and parasitic resistances with each of other capacitors CTS111 and the like. Since, therefore, disturbance noise exerts the same influence on the N signal and S signal in each pixel unit PU, a high accuracy image signal can be obtained when the output amplifiers MA1 or MA2 outputs the difference between the N signal and the S signal. For the same reasons, patterns 5 and 6 arranged in the interconnection layers to connect to the capacitor CTN111 preferably have translational symmetry with patterns 5 and 6 arranged in the interconnection layers to connect to each of other capacitors CTN121, CTS111, and CTS121. For the purpose of preventing crosstalk between the interconnections, shield patterns 3 may be arranged adjacent to the patterns 5 and 6 which have been arranged in the interconnection layers to connect to the capacitors CTN111, CTN121, CTS111, and CTS121. For the same reasons, shield patterns 4 may be arranged to cover the capacitors CTN111, CTN121, CTS111, and CTS121. Furthermore, for example, the shield patterns 3 and 4 for the capacitor CTN111 preferably have translational symmetry with the shield patterns 3 and 4 for each of other capacitors CTN121, CTS111, and CTS121. The shield patterns 3 and 4 are preferably fixed at a ground potential or power supply potential.

Figure 5:
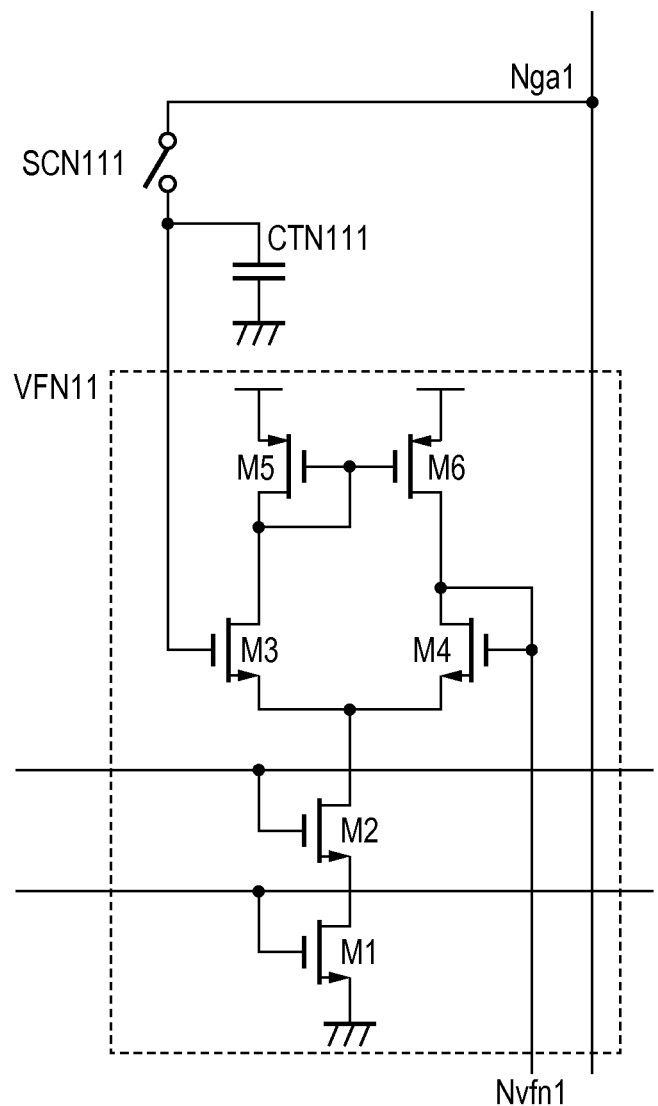
FIG. 5 is a circuit diagram for explaining an example of the arrangement of a first transfer portion.
Figure 8:
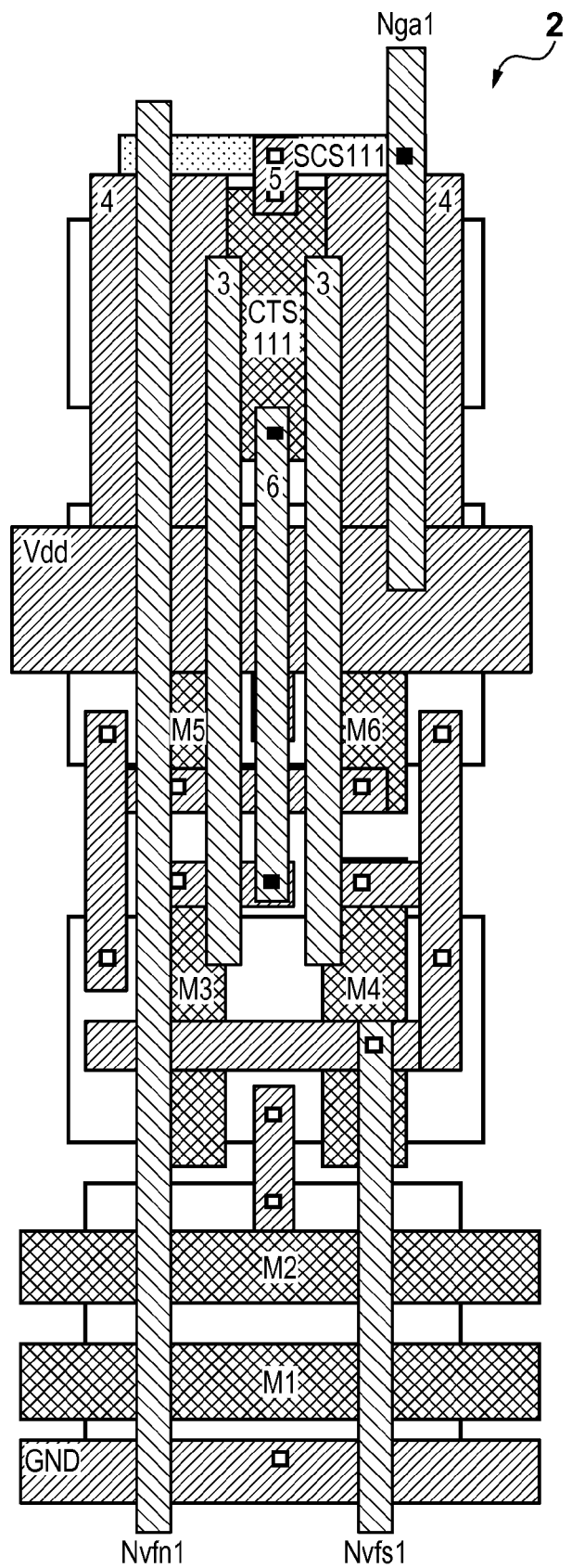
FIG. 8 is a view for explaining a practical example of the layout of the second transfer portion.

FIGS. 5 and 6 show practical examples of the circuit arrangement and layout of the region 1 including the switch SCN111, capacitor CTN111, and first transfer portion (buffer VFN11). Transistors M1 and M2 form a cascode current source in the buffer VFN11. The buffer VFN11 forms a voltage follower using the transistors M1 and M2 and transistors M3 to M6. Similarly, FIGS. 7 and 8 show practical examples of the circuit arrangement and layout of the region 2 including the switch SCS111, capacitor CTS111, and second transfer portion (buffer VFS11). As will be apparent by comparing FIGS. 6 and 8 with each other, the capacitors CTN111 and CTS111 preferably have translational symmetry. Furthermore, the buffers VFN11 and VFS11 preferably have translational symmetry in at least the active area and polysilicon, and more preferably have translational symmetry also in the first interconnection layer and via1. The regions 1 and 2 preferably have translational symmetry. More specifically, the regions 1 and 2 preferably have translational symmetry in each layer arranged below the first interconnection layer. This arrangement enables to suppress a characteristic variation between columns in addition to the above-described noise, which is advantageous for an increase in number of pixels of the solid-state imaging apparatus and a high-speed reading operation of pixel signals.

A pattern for transmitting the output Nga1 of the gain amplifier GA11 is arranged in the interconnection layer on the region 1. A pattern for transmitting an output Nvfn1 of the buffer VFN11 is arranged in the interconnection layer on the region 2. In this embodiment, therefore, the shield pattern 4 and the like are arranged to cover the capacitor CTN111 and the like. The shield pattern 4 may be deleted by, for example, arranging the patterns for transmitting the outputs Nga1 and Nvfn1 outside the regions 1 and 2.

Although each transfer portion (the buffer VFN11 or the like) forms the voltage follower in this embodiment, it may form a source flower, a gain amplifier, or the like. Furthermore, although an analog switch formed by a combination of an NMOS transistor and PMOS transistor is preferably used as the switch SCN111 or the like, the switch may be formed by one of the transistors. In this embodiment, a column amplifier is arranged on each column. A column amplifier, however, may be commonly used for the plurality of pixel units PU.

Figure 9:
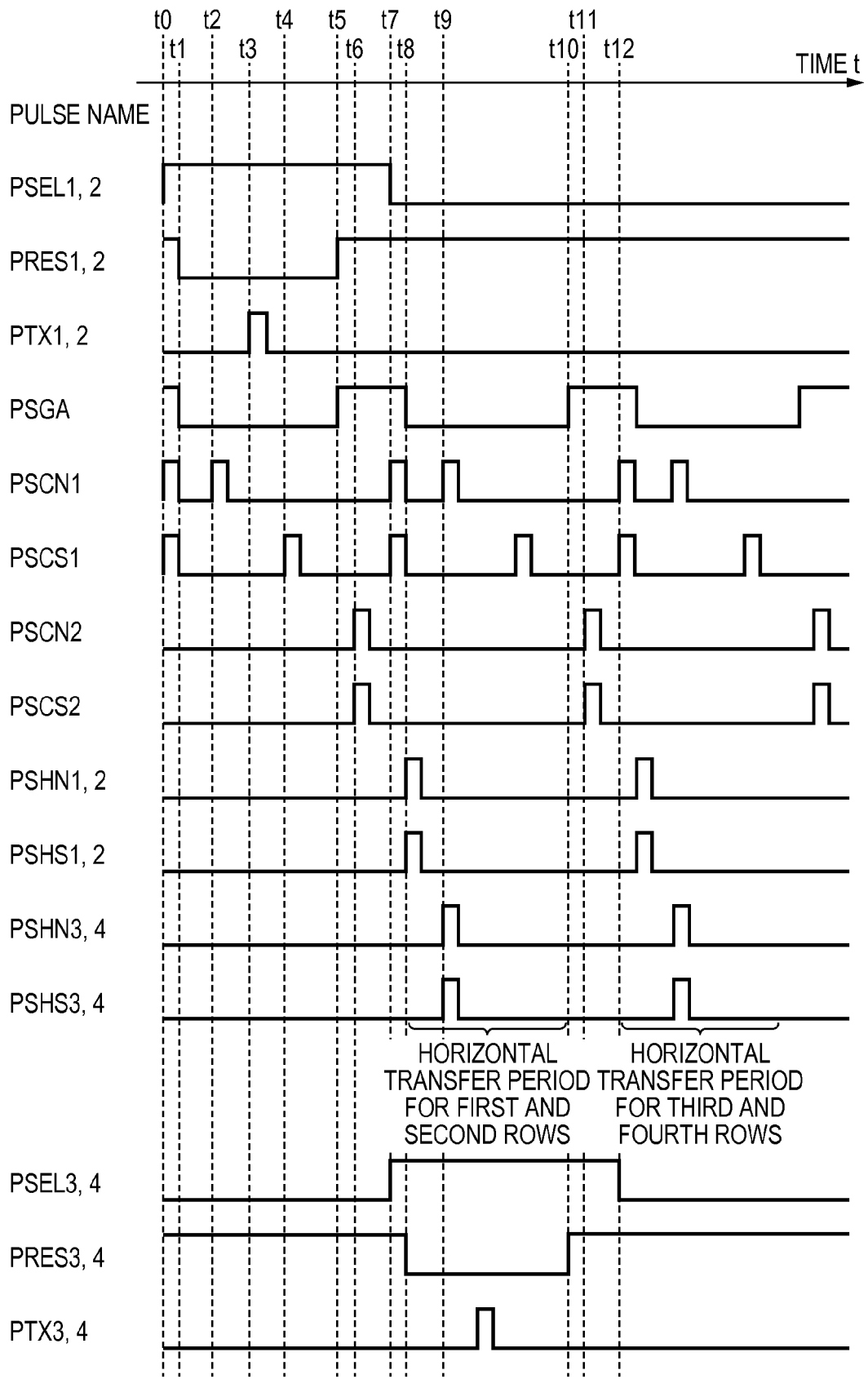
FIG. 9 is a timing chart for explaining an example of a driving method for the solid-state imaging apparatus according to the first embodiment.

An example of a driving method for the solid-state imaging apparatus 101 will be described. FIG. 9 is a timing chart showing an operation of driving the solid-state imaging apparatus 101. Control signals PSEL1, PSEL2, PRES1, PRES2, PTX1, and PTX2 are as described above, and a description thereof will be omitted. A control signal PSGA is used to control the states of the switches SGA11 and SGA21 (to set the switches to a conductive state or non-conductive state). A control signal PSCN1 is used to control the states of the switches SCN111 and SCN121. A control signal PSCS1 is used to control the states of the switches SCS111 and SCS221. A control signal PSCN2 is used to control the states of switches SCN211 and SCN221. A control signal PSCS2 is used to control the states of switches SCS211 and SCS221. A control signal PSHN1 is used to control the state of a switch SHN11. A control signal PSHS1 is used to control the state of a switch SHS11. A control signal PSHN2 is used to control the state of a switch SHN21. A control signal PSHS2 is used to control the state of a switch SHS21. Assume that when each of these control signals is set to high level, a control target transistor or switch is set to a conductive state, and when each control signal is set to low level, a control target transistor or switch is set to a non-conductive state.

At a time t0, PSEL1 and PSEL2 are set to high level. The selection transistors M411, M412, M421, and M422 are, therefore, set to a conductive state, thereby selecting the pixel units PU on the first and second rows of the pixel array 10. At the time t0, PSGA is also at high level. The gain amplifier GA11 and a gain amplifier GA21 are thus set to a voltage follower state for a bias voltage Vref. Furthermore, PSCN1 and PSCS1 are set to high level. The switches SCN111, SCS111, SCN121, and SCS121 are thus set to a conductive state, and the capacitors CTN111, CTS111, CTN121, and CTS121 can be charged to the reset voltage Vref.

At a time t1, PRES1 and PRES2 are set to low level. The reset transistors M211, M212, M221, and M222 are thus set to a non-conductive state, and the reset state of each pixel unit PU is cancelled. As described above, therefore, each of the column signal lines NV11 and NV21 can transmit an output in the reset operation of each selected pixel unit PU on each column. At the time t1, PSGA is set to low level. The gain amplifier GA11, therefore, enters an operation mode in which a signal transmitted through the column signal line NV11 is amplified with an amplification factor Cf11/Ci11. Furthermore, the gain amplifier GA21 enters an operation mode in which a signal transmitted through the column signal line NV21 is amplified with an amplification factor Cf21/Ci21. At the time t1, PSCN1 and PSCS1 are set to low level. The switches SCN111, SCS111, SCN121, and SCS121 are thus set to a non-conductive state, thereby terminating charging of the capacitors CTN111, CTS111, CTN121, and CTS121.

At a time t2, PSCN1 is set to high level. The capacitor CTN111 can thus hold an N signal which has been output from the pixel unit PU on the first row and first column, and amplified through the column amplifier. Similarly, the capacitor CTN121 can hold an N signal which has been output from the pixel unit PU on the second row and first column, and amplified through the column amplifier.

At a time t3, PTX1 and PTX2 are set to high level. In the pixel unit PU on the first row and first column, for example, the transfer transistor M111 is set to a conductive state, and a pixel signal corresponding to charges accumulated in the photoelectric conversion element D11 is output to the column signal line NV11 as described above. This also applies to the remaining pixel units PU. As described above, therefore, for each selected pixel unit PU on each column, each of the column signal lines NV11 and NV21 can transmit an output component in the reset operation and a signal component corresponding to the amount of light incident on the pixel unit.

At a time t4, PSCS1 is set to high level. The capacitors CTS111 and CTS121 can thus hold S signals from the column signal lines NV11 and NV21, respectively, which have been amplified through the column amplifier.

At a time t5, PRES1 and PRES2 are set to high level. Each pixel unit PU is thus set to a reset state. At this time, the processing of holding, in the capacitors CTN111 and CTS111, the pixel signals (the N signal and S signal) of the pixel unit PU on the first row and first column ends. Furthermore, the processing of holding, in the capacitors CTN121 and CTS121, the pixel signals (the N signal and S signal) of the pixel unit PU on the second row and first column ends.

At a time t6, PSCN2 is set to high level. The buffers VFN11 and VFN21 transfer the N signals held in the capacitors CTN111 and CTN121 to the capacitors CTN211 and CTN221, which then hold the N signals, respectively. At the time t6, PSCS2 is also set to high level. Similarly, the buffers VFS11 and VFS21 transfer the S signals held in the capacitors CTS111 and CTS121 to the capacitors CTS211 and CTS221, which then hold the S signals, respectively.

At a time t7, PSEL1 and PSEL2 are set to low level, and PSEL3 and PSEL4 are set to high level. The pixel units PU on the first and second rows of the pixel array 10 are unselected, and the pixel units PU on the third and fourth rows are selected. At the time t7, PSCN1 and PSCS1 are set to high level. Similarly to the operation at the time t0, the capacitors CTN111, CTS111, CTN121, and CTS121 can be charged to the reset voltage Vref. Note that in the pixel units PU on the third and fourth rows, the same processing as that executed during the time t0 to t7 in the pixel units on the first and second rows can be performed during a time t7 to t12. A description of the processing in the pixel units PU on the third and fourth rows, therefore, will be omitted.

At a time t8, PSHN1 and PSHS1 are set to high level. The switches SHN1 and SNS1 are thus set to a conductive state, and the N signal held in the capacitor CTN211 and the S signal held in the capacitor CTS211 are output to the horizontal transfer lines 7 and 8, respectively. After that, the output amplifier MA1 can output the difference between the N signal and the S signal. This processing will be referred to as "horizontal transfer" hereinafter. At the time t8, PSHN2 and PSHS2 are also set to high level. Similarly, the N signal held in the capacitor CTN221 and the S signal held in the capacitor CTS221 are output to the horizontal transfer lines 27 and 28, respectively. The output amplifier MA2 can output the difference between the N signal and the S signal. The same processing as that described above has been executed through the reading portion 16 for the pixel units PU on the first and second rows and second column.

At a time t9, PSHN3, PSHS3, PSHN4, and PSHS4 are set to high level. Horizontal transfer for the pixel signals of the pixel unit PU (corresponding to the column signal lines NV13) on the first row and third column of the pixel array 10 and that for the pixel signals of the pixel unit PU (corresponding to the column signal line NV23) on the second row and third column of the pixel array 10 are thus performed. Similarly, the same processing is sequentially executed for the pixel units on the first and second rows and the fourth column and subsequent columns of the pixel array 10.

Assume that a time t10 indicates a given time when horizontal transfer for each column ends for the pixel units on the first and second rows of the pixel array 10. During a time t7 to t10, processing of holding, in the capacitors STN111, CTS111, and the like, the pixel signals (the N signal and S signal) of the pixel units PU on the third and fourth rows of the pixel array 10 ends, similarly to the above-described processing (during the time t0 to t5). Furthermore, during the time t7 to t10, horizontal transfer for the pixel signals of the pixel units PU on the first and second rows of the pixel array 10 is executed in parallel with processing of reading out the pixel signals of the pixel units PU on the third and fourth rows, and holding them in the capacitors CTN111, CTS111, and the like. A horizontal scanning period for one row of the pixel array 10 is thus shortened, thereby enabling to increase the frame speed.

At a time t11, PSCN2 and PSCS2 are set to high level. Similarly to the above-described processing (at the time t6), the N signal and S signal are transferred to the capacitors CTS211 and the like, and held in them.

At a time t12, PSEL3 and PSEL4 are set to low level, and PSEL5 and PSEL6 (neither of which are shown) are set to high level. Processing for the pixel signals of pixel units PU on the fifth and sixth rows of the pixel array 10 starts, similarly to the above-described processing (at the time t7). In this way, it is possible to drive the solid-state imaging apparatus 101.

According to this embodiment, for example, the above-described driving method can also suppress noise and a characteristic variation as described above, which is advantageous for an increase in number of pixels of the solid-state imaging apparatus and a high-speed readout operation of pixel signals.

Figure 10:
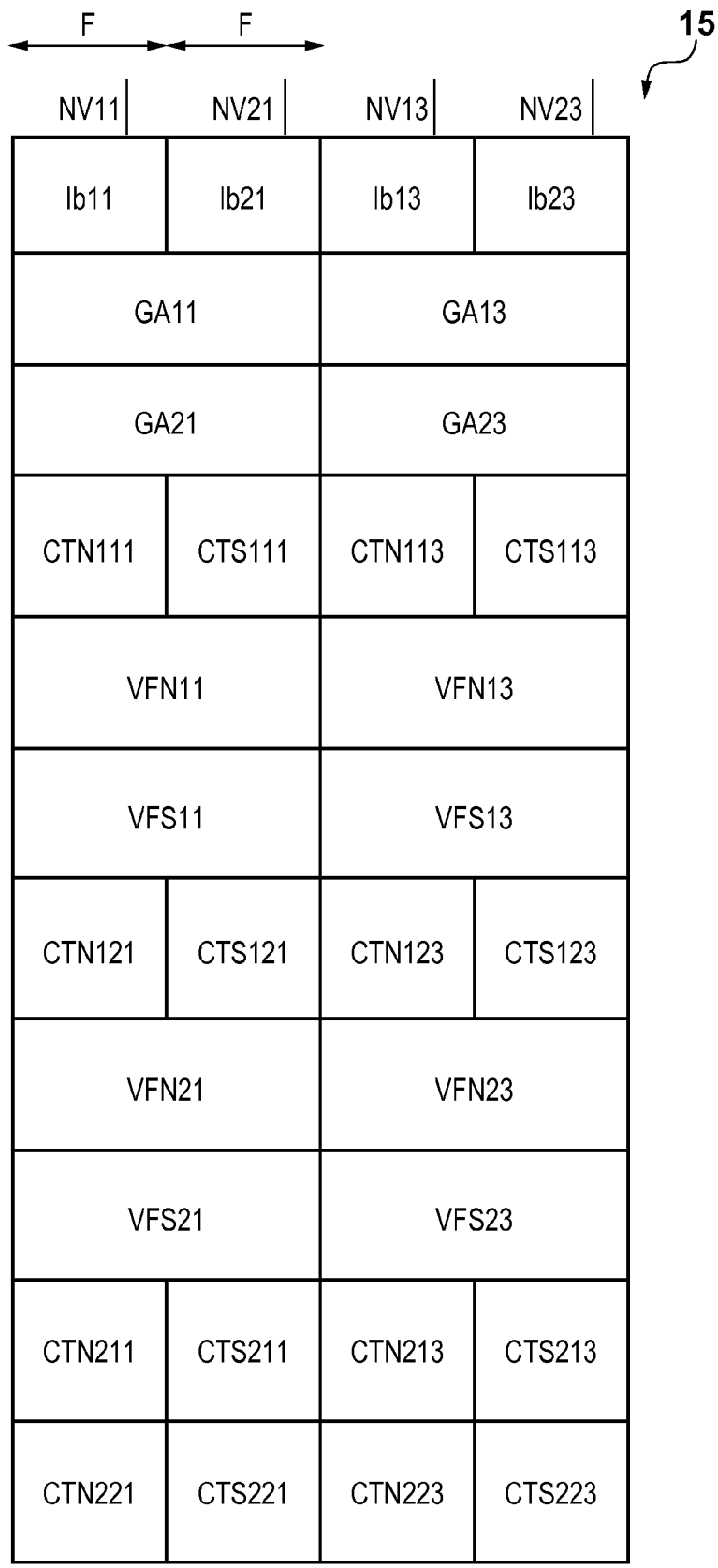
FIG. 10 is a view for explaining another embodiment of the layout.

In this embodiment, as shown in FIG. 10, a reading portion 15 for the pixel units PU on the odd-numbered rows may be arranged at a position different from that of a reading portion 15 for the pixel units PU on the even-numbered rows in the direction parallel to the column direction of the pixel array 10. Reference symbols used in FIG. 10 respectively denote the same components as those described above. With such a layout arrangement, the reading portion 15 including processing portions 18 may be associated with each column of the pixel array 10, which enables to obtain the same effects as those described above. Furthermore, a transfer portion (the buffer VFN11 and the like) or column amplifier (the gain amplifier GA11, the capacitors Cf11 and Ci11, and the like) including many elements need only be arranged within a width which is twice as long as the pixel pitch F, which is advantageous in designing the layout of a solid-state imaging apparatus.

Second Embodiment

Figure 11:
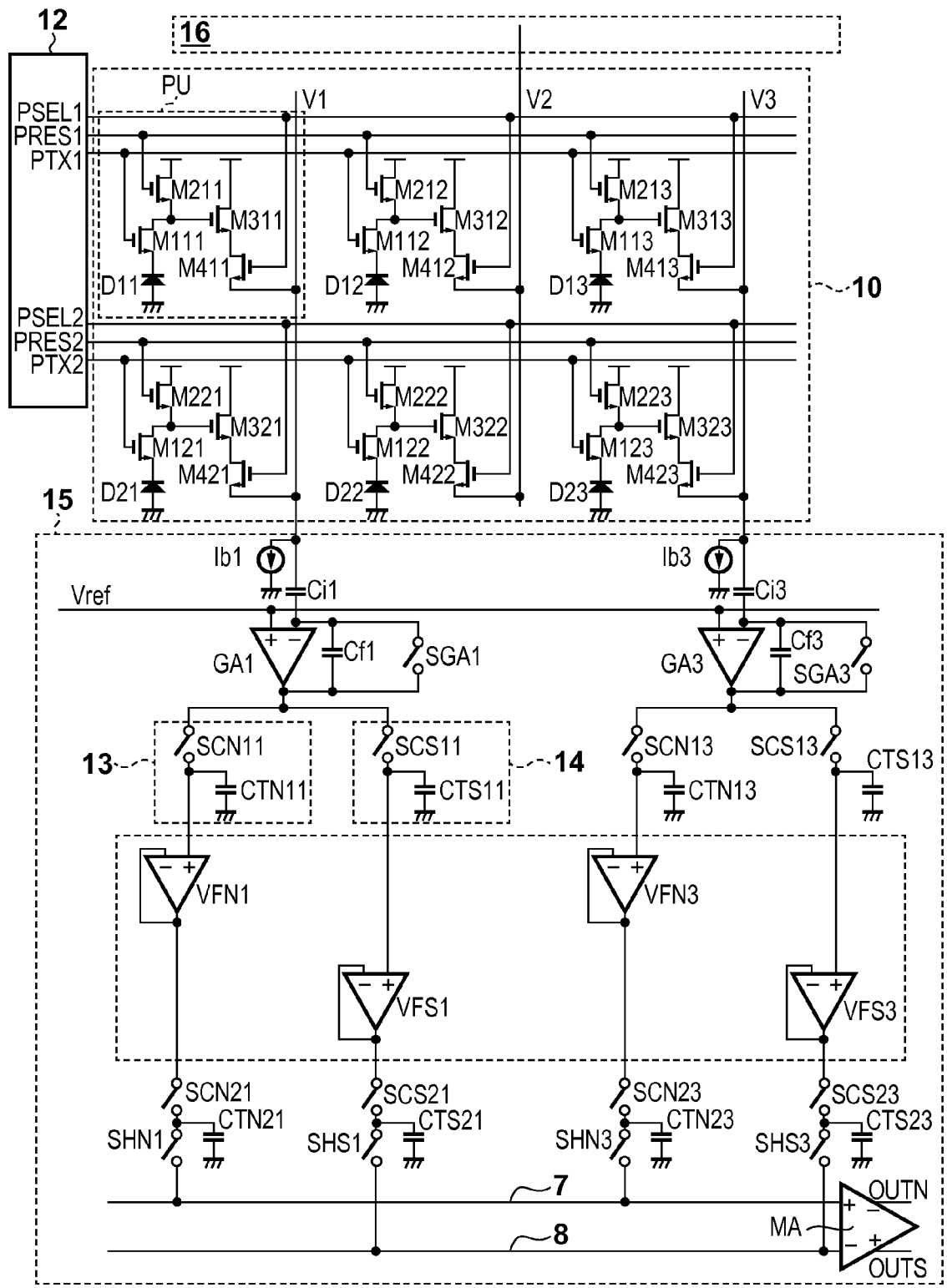
FIG. 11 is a circuit diagram for explaining an example of the arrangement of a solid-state imaging apparatus according to the second embodiment.

A solid-state imaging apparatus 102 according to the second embodiment will be described with reference to FIGS. 11 to 13. FIG. 11 shows an example of the arrangement of the solid-state imaging apparatus 102. The solid-state imaging apparatus 102 is different from that in the first embodiment in that a first front-side capacitor CTN11 and a second front-side capacitor CTS11 are arranged at different positions in a direction perpendicular to the column direction of a pixel array 10. Furthermore, in the solid-state imaging apparatus 102, one column signal line V1 or the like is arranged for each column of the pixel array 10, and thus the solid-state imaging apparatus 102 includes one output portion (output portion MA).

For a transfer portion including a buffer VFN1 for transferring an N signal from the capacitor CTN11 to a capacitor CTN21, and a buffer VFS1 for transferring an S signal from the capacitor CTS11 to a capacitor CTS21, for example, an amplifier circuit as described above can be used. Such a transfer portion, however, includes a large number of elements, and may thus be difficult to arrange within a pixel pitch F. To the contrary, a switch or capacitor includes a small number of elements, and is thus easy to arrange within the pixel pitch F. In this embodiment, therefore, the first front-side capacitor CTN11 and the second front-side capacitor CTS11 are arranged at different positions in the direction perpendicular to the column direction of the pixel array 10.

Figure 12:
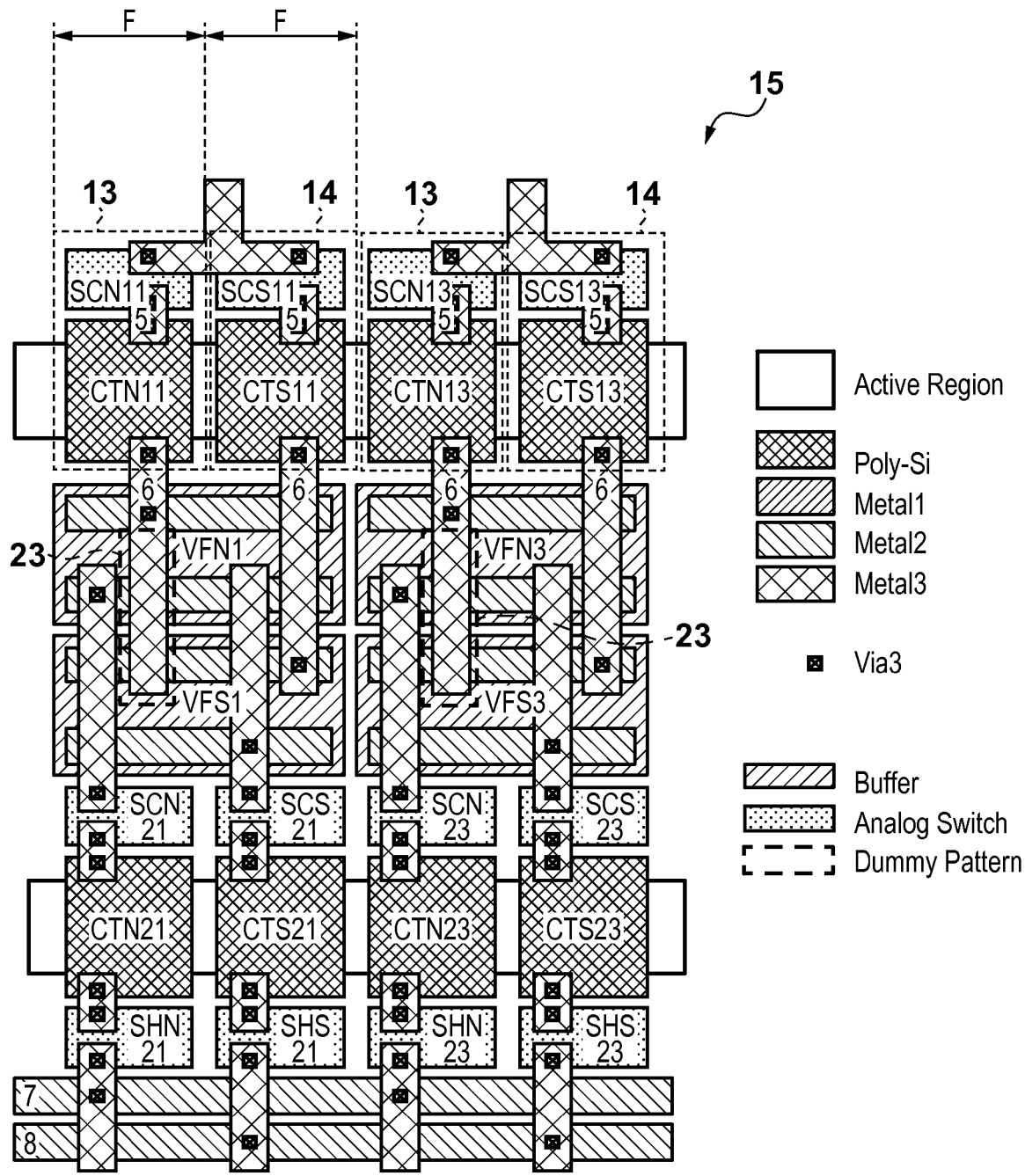
FIG. 12 is a view for explaining a practical example of the layout of the solid-state imaging apparatus according to the second embodiment.
Figure 13:
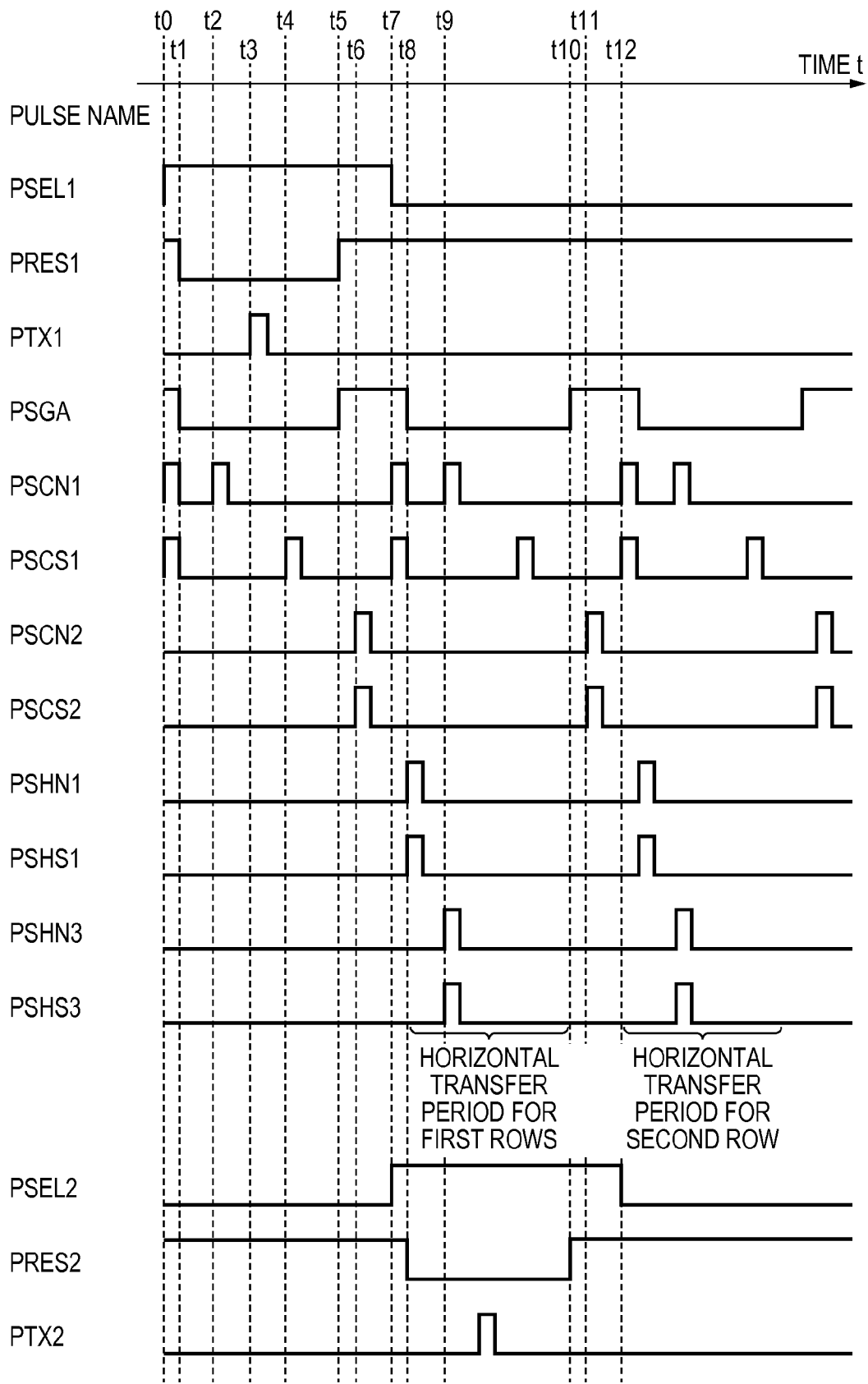
FIG. 13 is a timing chart for explaining an example of a driving method for the solid-state imaging apparatus according to the second embodiment.

FIG. 12 shows a practical example of the layout of processing portions 18 according to this embodiment. A second interconnection layer and a third interconnection layer (Meta3) are electrically connected through via 3 (Via3). A region 13 shown in FIGS. 11 and 12 includes a switch SCN11 (or SCN13) and the capacitor CTN11 (or CTN13). A region 14 includes a switch SCS11 (or SCS13) and the capacitor CTS11 (or CTS13). Other reference symbols respectively denote the same components as those in the first embodiment.

As described above, the regions 13 and 14 are arranged at different positions in the direction perpendicular to the column direction of the pixel array 10. On the other hand, the buffers VFN1 (or VFN3) and VFS1 (or VFS3) are arranged at different positions in a direction parallel to the column direction. Pairs of the buffers VFN1 and VFN3, and the buffers VFS1 and VFS3 preferably have translational symmetry with respect to at least an active area and polysilicon, and more preferably have translation symmetry with respect to a first interconnection layer, via 1, and the second interconnection layer. Patterns 6 in interconnection layers for connecting the capacitors CTN11, CTS11, CTN13, and CTS13 to the buffers VFN1, VFS1, VFN3, and VFS3, respectively, preferably have translational symmetry. As shown in FIG. 12, for example, a pattern (dummy part 23) longer than that with an enough length is preferably arranged in each interconnection layer. Although not shown, a shield pattern may be arranged adjacent to each interconnection 5 for connecting the switch SCN11 or the like to the capacitor CTN11 or the like, and each interconnection 6 for connecting the capacitor CTN11 or the like to the buffer VFN1 or the like. The operation is the same as that in the first embodiment, and a description thereof will be omitted. FIG. 13 is a timing chart showing an operation of driving the solid-state imaging apparatus 102.

According to this embodiment, it is not necessary to arrange a circuit portion including a large number of elements such as a transfer portion within the pixel pitch F. This is, therefore, advantageous in designing the layout of a solid-state imaging apparatus, and enables to suppress noise and a characteristic variation as described above.

Third Embodiment

Figure 14:
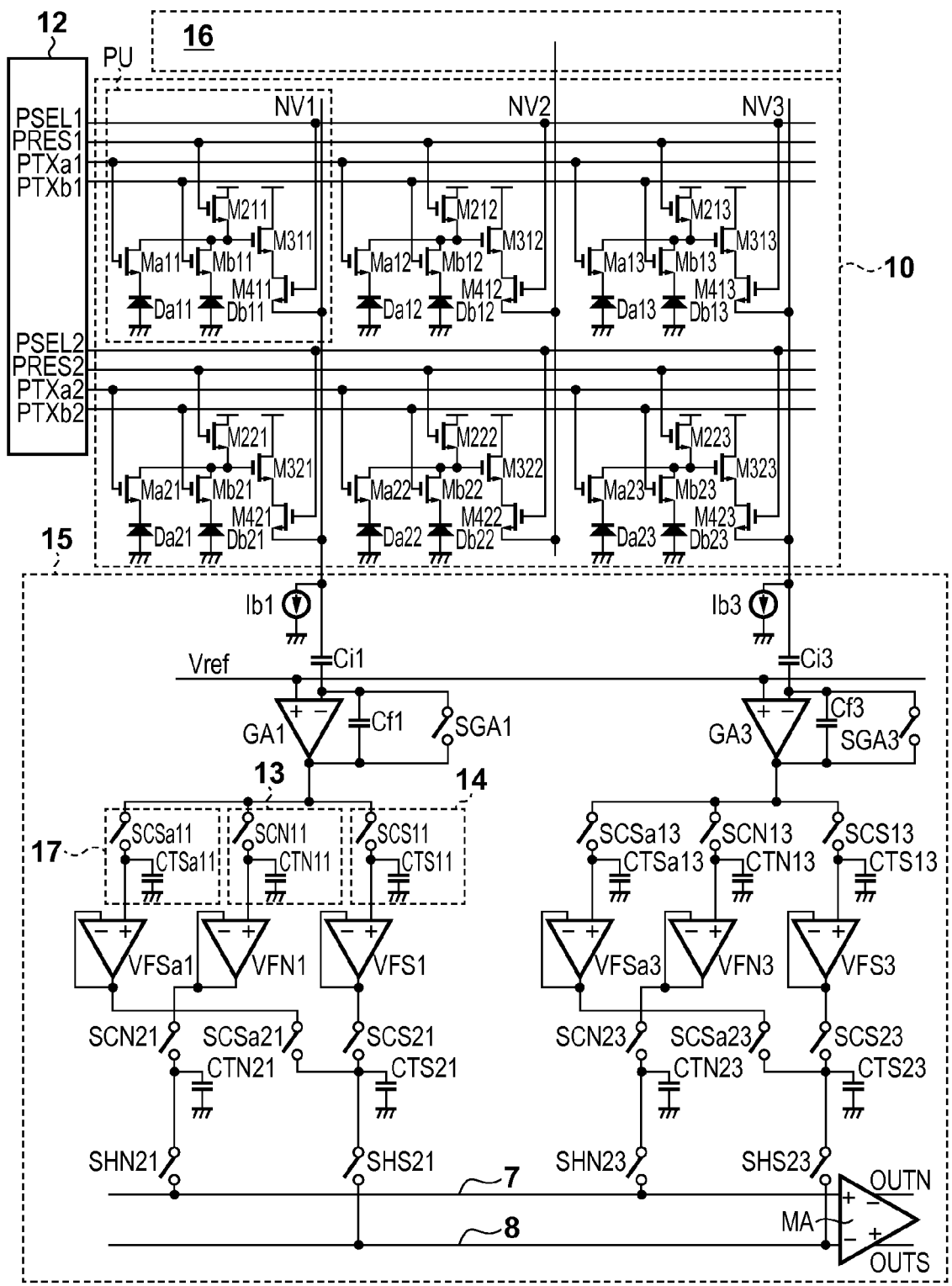
FIG. 14 is a circuit diagram for explaining an example of the arrangement of a solid-state imaging apparatus according to the third embodiment.

A solid-state imaging apparatus 103 according to the third embodiment will be described with reference to FIGS. 14 to 16. The solid-state imaging apparatus 103 is different from that in the second embodiment in that each pixel unit PU includes a plurality of photoelectric conversion elements, as shown in FIG. 14. For example, a pixel unit PU on the first row and first column includes photoelectric conversion elements Da11 and Db11. This arrangement can be used for focus detection using a phase-difference detection method.

FIG. 14 shows 2×3 pixel units PU of a pixel array 10. Note that photoelectric conversion elements Da11 to Da23 indicate photodiodes for reading out a first image. Photoelectric conversion elements Db11 to Db23 indicate photodiodes for reading out a second image. Transistors Ma11 to Ma23 serve as transfer transistors which correspond to the photoelectric conversion elements Da11 to Da23, respectively. Transistors Mb11 to Mb23 serve as transfer transistors which correspond to the photoelectric conversion elements Db11 to Db23, respectively. Switches SGA1 and SGA3 are used to reset gain amplifiers GA1 and GA3, respectively. Part of a reading portion 15 corresponding to the first column will be described below. When a switch SCSa11 is set to a conductive state, pixel signals for the first image are read out, and held in a capacitor CTSa11. A transfer portion (a buffer VFSa1 in this example) transfers the signals held in the capacitor CTSa11 to a capacitor CTS21 via a switch SCSa21, and the capacitor CTS21 holds the signals. This also applies to part of the reading portion 15 corresponding to the third column. Other reference symbols respectively denote the same components as those in the first and second embodiments.

The solid-state imaging apparatus 103 can perform focus detection according to image signals for each of the first and second images, which have been read out from the respective pixel units P of the whole (or part) of the pixel array 10. More specifically, focus detection is performed according to the difference (phase difference) between first data based on the first image and second data based on the second image, and focusing is performed based on the result of the focus detection so that the peak of the first data coincides with that of the second data. It is also possible to acquire three-dimensional video information by measuring a distance to each part of an object in addition to the focus detection.

FIG. 15 shows a practical example of the layout of processing portions 18 according to this embodiment. The switches SCSa11, SCN11, and SCS11 are arranged at different positions in a direction perpendicular to the column direction of the pixel array 10. Furthermore, the capacitors CTSa11, CTN11, and CTS11 are arranged at different positions in the direction perpendicular to the column direction of the pixel array 10. On the other hand, the transfer portions (the buffers VFSa11, VFN11, and VFS11) are arranged at different positions in a direction parallel to the column direction of the pixel array 10. This arrangement is used for the same reasons as those described in the second embodiment.

The pairs of the switch SCSa11 and capacitor CTSa11 (a region 17), the switch SCN11 and capacitor CTN11 (a region 13), and the switch SCS11 and capacitor CTS11 (a region 14) preferably have translational symmetry. Furthermore, the buffers VFSa11, VFN11, and VFS11 preferably have translational symmetry. In particular, patterns each including a dummy part (indicated by broken lines in FIG. 15) are used as the patterns arranged in the second or first interconnection layer, and preferably have translational symmetry. Although not shown, shield patterns to be arranged preferably have translational symmetry. Adopting the above-described layout arrangement is advantageous in designing the layout of a solid-state imaging apparatus with a large number of pixels, and enables to suppress noise and a characteristic variation as described above.

An example of a driving method for the solid-state imaging apparatus 103 will be described. FIG. 16 is a timing chart showing an operation of driving the solid-state imaging apparatus 103. A control signal PTXa1 is used to control the states of the transfer transistors Ma11, Ma12, and Ma13. A control signal PTXb1 is used to control the states of the transfer transistors Mb11, Mb12, and Mb13. A control signal PTXa2 is used to control the states of the transfer transistors Ma21, Ma22, and Ma23. A control signal PTXb2 is used to control the states of the transfer transistors Mb21, Mb22, and Mb23. A control signal PSCSa1 is used to control the states of the switches SCSa11 and SCSa13. A control signal PSCSa2 is used to control the states of the switches SCSa21 and SCSa23. Other reference symbols respectively denote the same components as those described above.

At a time t0, PSEL1 is set to high level. Pixel units PU on the first row of the pixel array 10 are thus selected. At the time t0, PSGA is also at high level. The gain amplifiers GA1 and GA3 are set to a voltage follower state for a bias voltage Vref. Furthermore, at the time t0, PSCN1, PSCSa1, and PSCS1 are set to high level. The switches SCN11, SCSa11, SCS11, SCN13, SCSa13, and SCS13 are thus set to a conductive state. The capacitors CTN11, CTSa11, CTS11, CTN13, CTSa13, and CTS13, therefore, can be charged to the reset voltage Vref.

At a time t1, PRES1 is set to low level. Reset transistors M211, M212, and M213 are set to a non-conductive state, and the reset state of each pixel unit PU is cancelled. As described above, therefore, each of column signal lines NV11 and NV21 can transmit an output in the reset operation of each selected pixel unit PU on each column. At the time t1, PSGA is set to low level. The gain amplifier GA1, therefore, enters an operation mode in which a signal transmitted through the column signal line NV1 is amplified with an amplification factor Cf1/Ci1. Furthermore, the gain amplifier GA3 enters an operation mode in which a signal transmitted through the column signal line NV3 is amplified with an amplification factor Cf3/Ci3. At the time t1, PSCN1, PSCSa1, and PSCS1 are set to low level. The switches SCN11, SCSa11, SCS11, SCN13, SCSa13, and SCS13 are thus set to a non-conductive state, thereby terminating charging of the capacitors CTN11, CTSa11, CTS11, CTN13, CTSa13, and CTS13.

At a time t2, PSCN1 is set to high level. The capacitor CTN11 can thus hold an N signal which has been output from the pixel unit PU on the first row and first column, and amplified through a column amplifier. Similarly, the capacitor CTN13 can hold an N signal which has been output from the pixel unit PU on the first row and third column, and amplified through a column amplifier.

At a time t3, PTXa1 is set to high level. In the pixel unit PU on the first row and first column, for example, the transfer transistor Ma11 is set to a conductive state, and a pixel signal corresponding to charges accumulated in the photoelectric conversion element Da11 is output to the column signal line NV1 as described above. This also applies to the remaining pixel units PU on the first row. As described above, therefore, for each selected pixel unit PU on each column, each of the column signal lines NV1 and NV3 can transmit an output component in the reset operation and a signal component corresponding to the amount of light incident on the pixel unit PU.

At a time t4, PSCSa1 is set to high level. The capacitors CTSa11 and CTSa13 can thus hold signals (to be referred to as "Sa signals" hereinafter) from the column signal lines NV1 and NV3, respectively, which have been amplified through the respective column amplifiers.

At a time t5, PSCN2 is set to high level. Switches SCN21 and SCN23 are thus set to a conductive state, thereby holding N signals from the column signal lines NV1 and NV3 in capacitors CTN21 and CTN23, respectively, which have been amplified through the respective column amplifiers. At the time t5, PSCSa2 is also set to a high level. The switches SCSa21 and SCSa23 are thus set to a conductive state, thereby holding Sa signals in the capacitors CTS21 and CTS23.

At a time t6, PSHN1 and PSHS1 are set to high level. Switches SHN21 and SHS21 are thus set to a conductive state, thereby performing horizontal transfer for the N signal held in the capacitor CTN21 and the Sa signal held in the capacitor CTSa21. An output amplifier MA can output the difference between the N signal and the Sa signal. At the time t6, PTXa1 and PTXb1 are also set to high level. The transfer transistors Ma11, Ma12, Mb11, and Mb12 are thus set to a conductive state. In the pixel unit PU on the first row and first column, therefore, signals respectively corresponding to charges accumulated in the photoelectric conversion elements Da11 and Db11 are output to the column signal line NV1. Each signal transmitted to each column signal line NV1 or the like is amplified by the corresponding column amplifier, and output as an S signal obtained by adding the Sa signal and an Sb signal. Note that the Sb signal indicates a signal component obtained by amplifying, using the column amplifier, the signal corresponding to the charges accumulated in the photoelectric conversion element Db11 of the photoelectric conversion elements Da11 and Db11.

At a time t7, PSHN2 and PSHS2 are set to high level. Switches SHN23 and SHS23 are thus set to a conductive state, thereby performing horizontal transfer for the N signal held in the capacitor CTN23 and the Sa signal held in the capacitor CTS23. The output amplifier MA can output the difference between the N signal and the Sa signal. At the time t7, PSCS1 is also set to high level. The switches SCS11 and SCS13 are thus set to a conductive state, thereby holding, in the capacitors CTS11 and CTS13, S signals (S signal=Sa signal+Sa signal) amplified through the column amplifiers on the respective columns.

At a time t8, PSCS1 is set to low level. The switches SCS11 and SCS13 are thus set to a non-conductive state. This operation terminates the processing of holding the S signal of the pixel unit PU on the first row and first column in the capacitor CTS11. Furthermore, the operation terminates the processing of holding the S signal of the pixel unit PU on the third row and first column in the capacitor CTS13.

At a time t9, horizontal transfer on the third column and subsequent columns is complete. At the time t9, PSCN2 is set to high level. The switches SCN21 and SCN23 are thus set to a conductive state. The N signals held in the capacitors CTN11 and CTN13 are transferred to the capacitors CTN21 and CTN23 via buffers VFN1 and VFN3, and held in the capacitors CTN21 and CTN23, respectively. At the time t9, PSCS2 is also set to high level. Similarly, the S signals held in the capacitors CTS11 and CTS13 are, therefore, transferred to the capacitors CTS21 and CTS23 via buffers VFS1 and VFS3, and held in the capacitors CTS21 and CTS23, respectively. During the time t6 to t9, horizontal transfer for the Sa signals and N signals of the pixel units PU on the first row of the pixel array 10 is executed in parallel with the processing of reading out the S signals and holding them in the capacitors CTN11, CTS13, and the like. A horizontal scanning period for one row of the pixel array 10 is thus shortened, thereby enabling to increase the frame speed.

At a time t10, PSCN1 and PSCS1 are set to high level. The switches SHN21 and SHS21 are thus set to a conductive state. The N signal held in the capacitor CTN21 and the S signal held in the capacitor CTS21 can undergo horizontal transfer. The output amplifier MA can output the difference between the N signal and the S signal. At this time, among the pixel signals on the first row and first column, the difference between the S signal and the N signal and that between the Sa signal and the N signal have been obtained. Based on the differences, it is possible to calculate an Sb signal. At the time t10, PSEL1 is set to low level, and PSEL2 is set to high level. This operation can start processing for the second row of the pixel array 10, as described above.

At a time t11, PSHN2 and PSHS2 are set to high level. The switches SHN23 and SHS23 are thus set to a conductive state. The N signal held in the capacitor CTN23 and the S signal held in the capacitor CTS23 can undergo horizontal transfer.

At a time t12, horizontal transfer for the N signal and S signal of pixel units PU (not shown) on the third column and subsequent columns is complete.

At a time 13, PSEL2 is set to low level, and PSEL3 (not shown) is set to high level. This operation starts processing for the pixel signals of the pixel units PU on the third row of the pixel array 10, as described above. In this way, it is possible to drive the solid-state imaging apparatus 103.

According to the embodiment, for example, the above-described driving method can also suppress noise and a characteristic variation as described above, which is advantageous for an increase in number of pixels of the solid-state imaging apparatus and a high-speed readout operation of pixel signals.

Although the three embodiments have been described above, the present invention is not limited to them. The objects, states, applications, functions, and other specifications of the present invention can be changed as needed, and other embodiments can implement the present invention, as a matter of course. The sensor portion, for example, is formed as a CMOS image sensor, and may be implemented as any other sensor.

Although the solid-state imaging apparatus included in a camera has been described in the above embodiments, the camera conceptually includes not only a device whose principal purpose is photographing but also a device (for example, a personal computer or portable terminal) additionally provided with a photographing function. The camera can include the solid-state imaging apparatus according to the present invention, which has been exemplified in the above embodiments, and an arithmetic processing portion for executing arithmetic processing for a signal output from the solid-state imaging apparatus. The processing portion can include, for example, an A/D converter, and a processor for processing digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-044307, filed Feb. 29, 2012, which is hereby incorporated by reference herein in its entirety.

What is claimed is:

1. A solid-state imaging apparatus comprising: a pixel array in which a plurality of pixel units are arranged to form a plurality of rows and a plurality of columns, and a plurality of processing portions each corresponding to each of the plurality of columns of the pixel array, the plurality of pixel units comprising a first pixel unit which includes a photoelectric conversion element, and a transistor which outputs, to a first column signal line, a signal corresponding to charges generated in the photoelectric conversion element, and the plurality of processing portions comprising a first processing portion which includes a first front-side capacitor configured to hold a first signal provided through the first column signal line and having a noise component, a first back-side capacitor arranged behind the first front-side capacitor, a second front-side capacitor configured to hold a second signal provided through the first column signal line and having the noise component and a signal component corresponding to an amount of light incident on a corresponding pixel unit, a second back-side capacitor arranged behind the second front-side capacitor, a first transfer portion configured to transfer the first signal from the first front-side capacitor to the first back-side capacitor, and a second transfer portion configured to transfer the second signal from the second front-side capacitor to the second back-side capacitor, wherein, in a physical layout of the apparatus, a position of the first transfer portion in a direction parallel to the first column signal line and a position of the second transfer portion in the direction parallel to the first column signal line are different from each other.

2. The solid-state imaging apparatus according to claim 1, wherein, in a physical layout of the apparatus, a position of the first front-side capacitor in the direction parallel to the first column signal line and a position of the second front-side capacitor in the direction parallel to the first column signal line are different from each other, or a position of the first front-side capacitor in a direction perpendicular to the first column signal line and a position of the second front-side capacitor in the direction perpendicular to the first column signal line are different from each other.

3. The solid-state imaging apparatus according to claim 1, wherein a pattern arranged in an interconnection layer for connecting the first front-side capacitor to the first transfer portion and a pattern arranged in an interconnection layer for connecting the second front-side capacitor to the second transfer portion have translational symmetry.

4. The solid-state imaging apparatus according to claim 3, wherein a shield pattern adjacent to the pattern arranged in the interconnection layer for connecting the first front-side capacitor to the first transfer portion and a shield pattern adjacent to the pattern arranged in the interconnection layer for connecting the second front-side capacitor to the second transfer portion have translational symmetry.

5. A camera comprising:

a solid-state imaging apparatus according to claim 1; and an arithmetic processing portion configured to execute arithmetic processing for a signal output from the solid-state imaging apparatus.

* * * * *